(12) United States Patent
Ding et al.

(10) Patent No.: US 11,367,767 B2
(45) Date of Patent: Jun. 21, 2022

(54) LIGHT EMITTING DIODE AND FABRICATION METHOD THEREOF, ARRAY SUBSTRATE AND DISPLAY PANEL

(71) Applicant: BOE TECHNOLOGY GROUP CO., LTD., Beijing (CN)

(72) Inventors: Xiaoliang Ding, Beijing (CN); Xue Dong, Beijing (CN); Haisheng Wang, Beijing (CN); Yingming Liu, Beijing (CN); Wei Liu, Beijing (CN); Xueyou Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 318 days.

(21) Appl. No.: 16/494,463

(22) PCT Filed: Nov. 1, 2018

(86) PCT No.: PCT/CN2018/113393
§ 371 (c)(1),
(2) Date: Sep. 16, 2019

(87) PCT Pub. No.: WO2020/087435
PCT Pub. Date: May 7, 2020

(65) Prior Publication Data
US 2021/0335963 A1    Oct. 28, 2021

(51) Int. Cl.
*H01L 51/52* (2006.01)
*H01L 27/32* (2006.01)
*H01L 51/56* (2006.01)

(52) U.S. Cl.
CPC ...... *H01L 27/3269* (2013.01); *H01L 51/5206* (2013.01); *H01L 51/5225* (2013.01);
(Continued)

(58) Field of Classification Search
None
See application file for complete search history.

(56) References Cited

U.S. PATENT DOCUMENTS

| 9,559,332 B2 | 1/2017 | Lee et al. |
| 10,276,550 B2 | 4/2019 | Han et al. |

(Continued)

FOREIGN PATENT DOCUMENTS

| CN | 103681758 A | 3/2014 |
| CN | 106898706 A | 6/2017 |

(Continued)

OTHER PUBLICATIONS

Office Action dated Feb. 11, 2021, issued in counterpart IN Application No. 201927045173, with English Translation. (5 pages).

(Continued)

*Primary Examiner* — Benjamin P Sandvik
(74) *Attorney, Agent, or Firm* — WHDA, LLP (57) ABSTRACT

The present disclosure is related to a light emitting diode. The light emitting diode includes a first transparent electrode layer; a light emitting layer on the first transparent electrode layer; a reflective electrode layer on a surface of the light emitting layer opposite from the first transparent electrode layer, and a second transparent electrode layer. The reflective electrode layer may include transmission hole. The second transparent electrode layer may cover or fill the transmission hole. The transmission hole may be configured to transmit light emitted from the light emitting layer to pass through the second transparent electrode layer.

18 Claims, 8 Drawing Sheets

(52) U.S. Cl.
CPC ........ *H01L 51/56* (2013.01); *H01L 2227/323* (2013.01); *H01L 2251/533* (2013.01)

(56) References Cited

U.S. PATENT DOCUMENTS

| | | | |
|---|---|---|---|
| 2005/0253790 A1* | 11/2005 | Uchida | H01L 27/3234 345/76 |
| 2007/0188085 A1* | 8/2007 | Young | H01L 27/3272 313/506 |
| 2007/0205420 A1* | 9/2007 | Ponjee | H01L 51/5203 257/80 |
| 2011/0240964 A1 | 10/2011 | Ko et al. | |
| 2015/0249119 A1* | 9/2015 | In | H01L 27/3246 257/40 |
| 2018/0123081 A1 | 5/2018 | Baik et al. | |
| 2018/0308875 A1 | 10/2018 | Xiao et al. | |
| 2020/0328260 A1* | 10/2020 | Tang | H01L 27/3227 |
| 2021/0223621 A1* | 7/2021 | Huang | G09G 3/006 |

FOREIGN PATENT DOCUMENTS

| | | |
|---|---|---|
| CN | 107611085 A | 1/2018 |
| CN | 108022954 A | 5/2018 |
| WO | 2018099176 A1 | 6/2018 |

OTHER PUBLICATIONS

International Search Report dated Aug. 7, 2019, issued in counterpart application No. PCT/CN2018/113393. (8 pages).

\* cited by examiner

LIGHT EMITTING DIODE AND FABRICATION METHOD THEREOF, ARRAY SUBSTRATE AND DISPLAY PANEL

TECHNICAL FIELD

This disclosure relates to a display technology, more particularly, to a light emitting diode and a fabrication method thereof, an array substrate, and a display panel.

BACKGROUND

As compared to other display apparatuses such as liquid crystal display (LCD) apparatuses, the organic light emitting diode (OLED) display apparatuses are self-emitting apparatuses that do not require a backlight. Having the advantages of fast response, a wider viewing angle, high brightness, more vivid color rendering, and being thinner and lighter, the OLED display apparatuses have found a wide range of applications in display field.

BRIEF SUMMARY

The present disclosure is related to a light emitting diode. The light emitting diode may include a reflective electrode layer with a transmission hole. A second transparent electrode layer is formed to cover or fill the transmission hole. Light from the pixel region of the light emitting diode can pass through the transmission hole and transmit through the second transparent electrode layer to reach the photosensitive sensor. The photosensitive sensor can sense intensity of the light emitted from each pixel region in real time.

Accordingly, one example of the present disclosure is a light emitting diode. The light emitting diode may include a first transparent electrode layer, a light emitting layer on the first transparent electrode layer, a reflective electrode layer on a surface of the light emitting layer opposite from the first transparent electrode layer, the reflective electrode layer comprising a transmission hole and a second transparent electrode layer covering and/or filling the transmission hole. The transmission hole may be configured to transmit light emitted from the light emitting layer to transmit through the second transparent electrode layer.

Another example of the present disclosure is an array substrate. The array substrate may include the light emitting diode according to one embodiment of the present disclosure and a thin film transistor (TFT) to drive the light emitting diode.

Another example of the present disclosure is a display panel. The display panel may include the light emitting diode according to one embodiment of the present disclosure.

Another example of the present disclosure is a method of fabricating a light emitting diode. The method of fabricating the light emitting diode may include forming a first transparent electrode layer, forming a light emitting layer on the first transparent electrode layer, forming a reflective electrode layer on the light emitting layer, forming a transmission hole in the reflective electrode layer, and forming a second transparent electrode layer to cover and/or fill the transmission hole. The transmission hole is configured to transmit light emitted from the light emitting layer to transmit through the second transparent electrode layer.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-10. When referring to the figures, like structures and elements shown throughout are indicated with like reference numerals.

Electronic compensating structures and methods are often employed in a large size Organic Light Emitting Diode (OLED) panel. However, these structures and methods can only compensate abnormal display due to characters of thin film transistors (TFT) in the OLED, but not abnormal display due to aging of materials of the emitting layers in the OLED.

Figure 1:
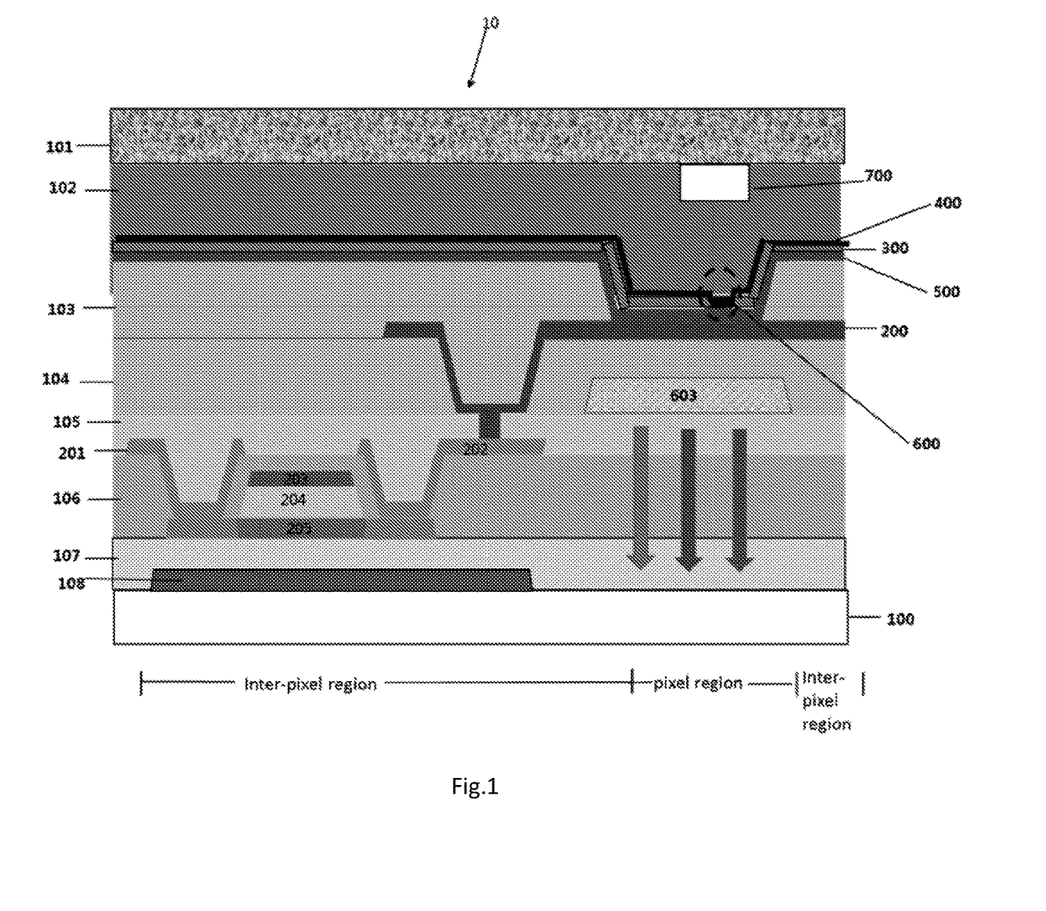
FIG. 1 is a diagram illustrating a structure of a light emitting diode according to some embodiments of the present invention.

Accordingly, FIG. 1 shows a schematic structure of a light emitting diode according to some embodiments of the present invention. In some embodiments, as shown in FIG. 1, the light emitting diode 10 includes a first transparent electrode layer 200, a light emitting layer 500 formed on the first transparent electrode layer 200, a reflective electrode layer 300 formed on a surface of the light emitting layer 500 opposite from the first transparent electrode layer 200. The reflective electrode layer includes a transmission hole 600. The light emitting diode 10 further includes a second transparent electrode layer 400 to cover and/or fill the transmission hole 600. The transmission hole 600 is configured to transmit light emitted from the light emitting layer 500 to transmit through the second transparent electrode layer 400. That is to say, light emitted from the light emitting layer 500 passes through the transmission hole 600, then reaches the second transparent electrode layer 400, and then transmits through the second transparent electrode layer 400.

In some embodiments, as shown in dotted circle in FIG. 1, the transmission hole 600 is formed in the reflective electrode layer 300. In some embodiments, the transmission hole 600 partially penetrates the reflective electrode layer 300. In some embodiments, the transmission hole 600 completely penetrates through the reflective electrode layer 300.

In some embodiments, the light emitting diode may include other layers (not shown in the drawings) such as an electron transport layer (ETL) and electron injection layer (EIL) between the reflective electrode layer 300 and the light emitting layer 500; and an hole transport layer (HTL) and a hole injection layer (HIL) between the first transparent electrode layer 200 and the light emitting layer 500. In some embodiments, the transmission hole 600 penetrates through the reflective electrode layer 300 and is in physical contact with the light emitting layer 500. In some embodiments, the transmission hole 600 penetrates through the reflective electrode layer 300 and is in physical contact with the closest layer such as EIL.

Figure 4:
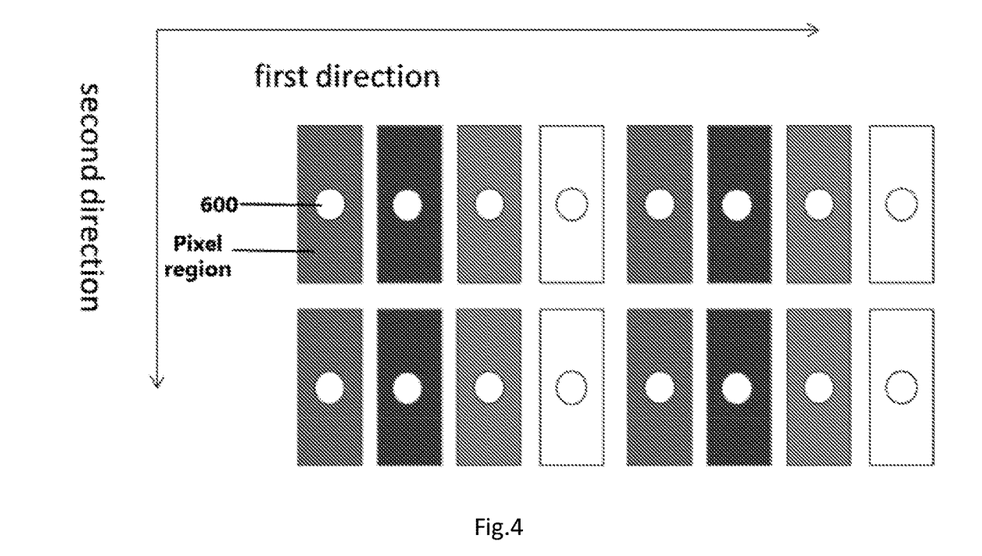
FIG. 4 is a diagram illustrating relative position of the transmission hole in each of a plurality of pixel regions of a light emitting diode according to some embodiments of the present invention.

In some embodiments, as shown in FIG. 4, each pixel region has one transmission hole 600. In some embodiments, at least one of the pixel regions has a plurality of transmission holes 600. In some embodiments, some pixel regions each have one transmission hole, and some pixel regions each have a plurality of transmission holes.

One function of the transmission hole is to transmit the light emitted from the light emitting layer 500 to the second transparent electrode layer 400. There is no limitation with regard to the extent or depth that the transmission hole penetrating into the reflective electrode layer 300. A depth of the transmission hole may be 50%, 65%, 75%, 85%, 90%, 99%, or 100% of a thickness of the reflective electrode layer. For example, the transmission hole 600 may 100% penetrate through the reflective electrode layer 300. In some embodiments, the transmission hole 600 may penetrate the reflective electrode layer 300 to a depth of about 99%, 90%-98%, 85%-89%, 75%-84%, 65%-74%, or 50%-64% of a thickness of the reflective electrode layer from a surface thereof facing the light emitting layer or opposite from the light emitting layer. If the transmission hole does not penetrate through the reflective electrode layer 300, the transmission hole can have an opening in a surface of the reflective electrode layer facing the light emitting layer or opposite from the light emitting layer. All the transmission holes in the plurality of pixel regions each may have a same or different depth inside the reflective electrode layer 300. In some embodiments, as shown in the FIG. 6, the transmission hole 600 includes a plurality of sub-holes 601 penetrating the reflective electrode layer 300. In some embodiments, the sub-holes 601 partially penetrate the reflective electrode layer 300. In some embodiments, the sub-holes 601 completely penetrate through the reflective electrode layer 300.

Figure 6:
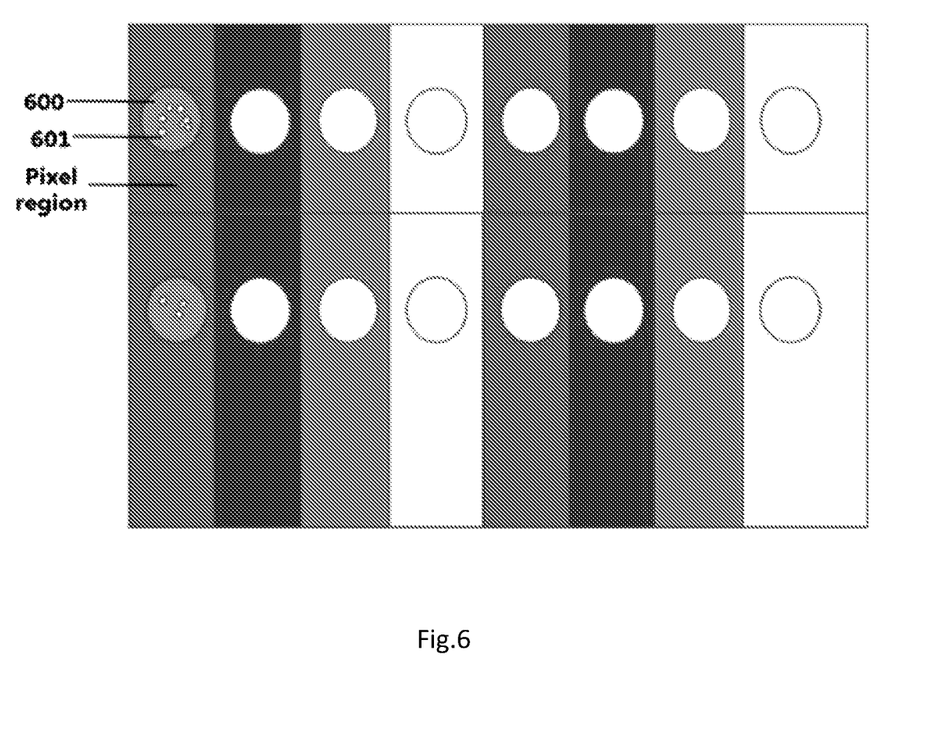
FIG. 6 is a diagram illustrating relative positions of the transmission hole in each of a plurality of pixel regions of a light emitting diode according to some embodiments of the present invention.

In some embodiments, as shown in FIG. 6, the reflective electrode layer 300 may include a plurality of sub-holes 601, and at least one of the pixel regions has the plurality of sub-holes 601. In some embodiments, some pixel regions each have one transmission hole 600, and some pixel regions each have the plurality of sub-holes 601. In some embodiments, each of the pixel regions has the plurality of sub-holes 601. In some embodiments, some pixel regions each have one transmission hole 600, some pixel regions each have the plurality of sub-holes 601, and some pixel regions each have a plurality of transmission holes 600.

One function of the transmission hole 600 and the sub-holes 601 is to transmit the light emitted from the light emitting layer 500 to the second transparent electrode layer 400. There is no limitation with regard to the extent that the sub-holes penetrate the reflective electrode layer. For example, the sub-holes 601 may 100% penetrate through the reflective electrode layer 300. In some embodiments, a depth of the sub-hole may be about 50%, 65%, 75%, 85%, 90%, 95%, 98%, or 100% of a thickness of the reflective electrode layer. All the sub-holes each may have a same or different depth inside the reflective electrode layer.

In some embodiments, the transmission hole may be a groove formed on the surface of the reflective electrode layer 300 facing the light emitting layer or opposite from the light emitting layer. In other words, the groove does not penetrate through the reflective electrode layer 300, and there is a distance from the bottom of the groove to an opposite surface of the reflective electrode layer 300. The opposite surface of the reflective electrode layer 300 is the surface opposite to the surface of the reflective electrode layer 300 where the groove is formed on. The distance must be small enough to realize the function of the transmission hole. In some embodiments, the groove penetrates through the reflective electrode layer 300.

In some embodiments, as shown in dotted circle in FIG. 1, the second transparent electrode layer 400 is filled inside the transmission hole 600 and further extends outside the transmission hole 600 to cover at least a portion of the reflective electrode layer 300. In some embodiments, the second transparent electrode layer 400 is a continuous layer except the transmission hole 600, and the second transparent electrode layer 400 is conformal with the reflective electrode layer 300. In some embodiments, the portion of the second transparent electrode layer 400 inside the transmission hole 600 contacts the side surface of the reflective electrode layer 300. In some embodiments, the second transparent electrode layer 400 is only inside the transmission hole 600 and contacts the side surface of the reflective electrode layer 300. In some embodiments, the light emitting diode further includes a transparent conductive material inside the transmission hole and the second transparent electrode layer 400 contacts the transparent conductive material. For example, the transparent conductive material may completely fill the transmission hole 600. In some embodiments the transparent conductive material may fill the transmission hole 600 to a height of 99%, 90%-98%, 85%-89%, 75%-84%, 65%-74%, or 50%-64% of a depth of the transmission hole 600. When the transparent conductive material fill in the transmission hole, the second transparent electrode layer 400 may be formed on the transparent conductive material.

In some embodiments, as shown in FIG. 1, the light emitting diode further includes a pixel definition layer 103 to define a plurality of pixel regions and a plurality of inter-pixel regions between adjacent pixel regions respectively. As shown in FIG. 4, each rectangle stands for a pixel region, and each of the plurality of pixel regions has one transmission hole. In some embodiments, at least one of the plurality of pixel regions has the transmission hole. In some embodiments, an area of the transmission hole in a pixel region is about 0.5%-10%, or about 1%-9%, or about 2% to 8%, or about 3% to 7%, or about 4% to 6%, or about 5% of an area of the corresponding pixel region. The area of the transmission hole in each of the plurality of the pixel regions may be the same or different. The area of the transmission hole refers to an area of a cross-section of the transmission hole in a plane parallel to a surface of the reflective electrode layer.

In some embodiments, as shown in FIG. 4, a relative position of the transmission hole in each of plurality of pixel regions is substantially the same. The transmission hole can be located in any position of the pixel region, and there is no limitation with regard to the position of the transmission hole because the area of the transmission hole is so small compared with the area of the pixel region. In some embodiments, the relative position of the transmission hole in each of plurality of pixel regions is the same.

In some embodiments, as shown in FIG. 4, each pixel region has the transmission hole, that is to say, the reflective electrode layer has a plurality of the transmission holes and each transmission hole is located at one pixel region.

The location or relative position of the transmission hole in each of the pixel regions has no special requirement because each transmission hole occupies a very small area of each pixel region. In some embodiments, as shown in FIG. 4, the relative position of the transmission hole 600 in each of plurality of pixel regions is the same. That is, all the transmission holes in the plurality of pixel regions are arranged along a straight line in a first direction or a second direction. In some embodiments, the relative position of the transmission hole 600 in each of plurality of pixel regions is substantially the same. That is, the centers of all the transmission holes in the plurality of pixel regions are arranged substantially along a straight line in a first direction or a second direction. "Substantially" used herein means that the straight line passes through at least a part of each of the transmission holes.

In some embodiments, the first direction is a row direction, and the second direction is a column direction. In some embodiments, the pixel regions are arranged in an array along with the first direction and the second direction as shown in FIG. 4. Each pixel region has a transmission hole, and the relative position of each transmission hole located in the corresponding pixel region is the same or substantially the same.

In some embodiments, as shown in FIG. 1, the light emitting diode includes a photosensitive sensor 700 and the photosensitive sensor 700 is configured to sense changes of intensity of light transmitted from the transmission hole 600 in the reflective electrode layer 300. Because of the existence of the transmission hole, light emitted from the light emitting layer 500 passes through the transmission hole 600 and then transmits through the second transparent electrode layer 400 to reach the photosensitive sensor 700. The dimension or size of transmission hole is related to photosensitive ability of the photosensitive sensor and/or detection accuracy requirement. There is no limitation with regard to the shape of the transmission hole, for example, a cross section of the transmission hole in a plane perpendicular the reflective electrode layer may be a rectangle or a trapezoid.

In some embodiments, as shown in FIG. 1, the photosensitive sensor 700 is formed on a side of the second transparent electrode layer 400 opposite from the first transparent electrode layer 200. An orthographic projection of the photosensitive sensor on the first transparent electrode layer 200 at least partially overlaps an orthographic projection of the transmission hole 600 on the first transparent electrode layer 200. In some embodiments, as shown in FIG. 1, the light emitting diode further includes a planarization layer 102 on a side of the second transparent electrode layer 400 opposite from the reflective electrode layer 300. The photosensitive sensor 700 is formed on a surface of the planarization layer 102 opposite from the second transparent electrode layer 400. In some embodiments, the photosensitive sensor 700 is formed on a groove formed on the planarization layer 102 as shown in FIG. 1. In some embodiments, the orthographic projection of the photosensitive sensor on the first transparent electrode layer 200 completely overlaps the orthographic projection of the transmission hole 600 on the first transparent electrode layer 200.

Figure 7:
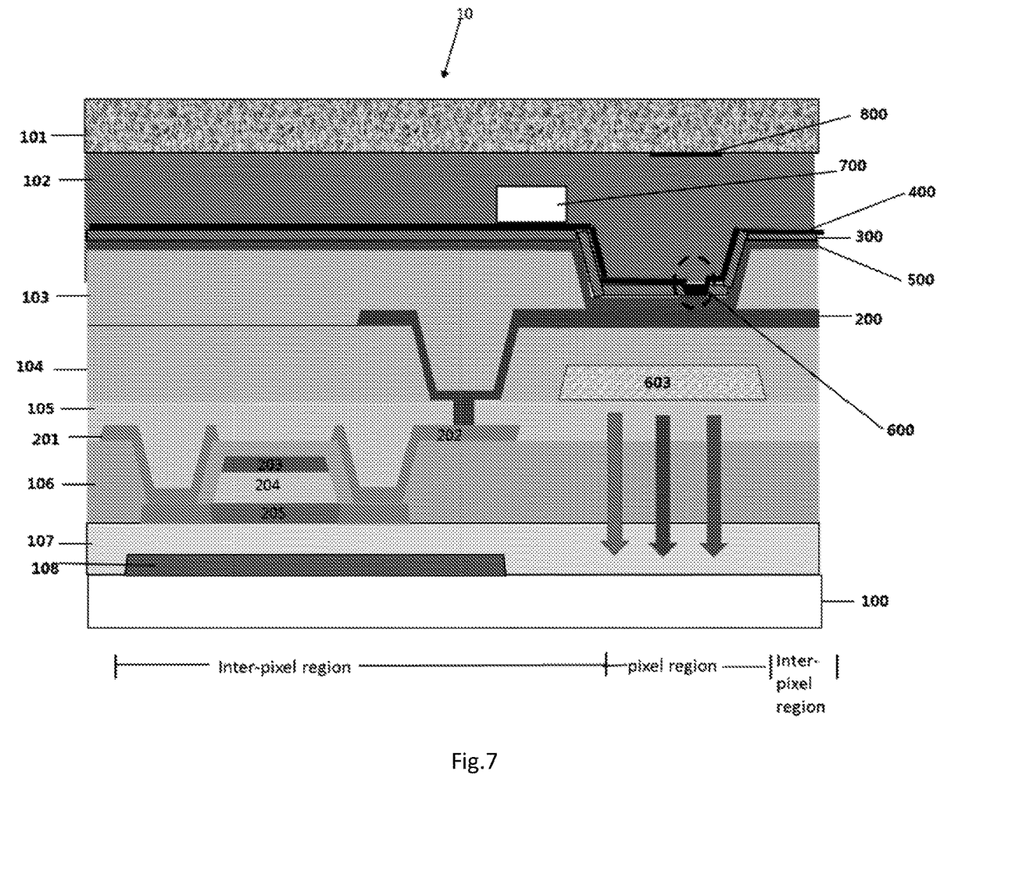
FIG. 7 is a diagram illustrating a structure of a light emitting diode according to some embodiments of the present invention.

The positional relationship between the photosensitive sensor and the transmission hole is not limited as long as the photosensitive sensor can sense changes of intensity of light transmitted from the transmission hole. In some embodiments, the orthographic projection of the photosensitive sensor on the first transparent electrode layer 200 does not overlap the orthographic projection of the transmission hole 600 on the first transparent electrode layer 200. In some embodiments, as shown in FIG. 7, the photosensitive sensor may be located at a side of the planarization layer facing the reflective electrode layer 300, or any position between the planarization layer 102 and the reflective electrode layer 300. The light emitting diode further includes a light reflective element 800. The light reflective element 800 may be a layer, a pattern, or particles having a function of reflecting light into the photosensitive sensor. The light reflective element 800 is configured to reflect light into the photosensitive sensor 700. In some embodiments, as shown in FIG. 7, an orthographic projection of the light reflective element 800 on the first transparent electrode layer 200 at least partially overlaps an orthographic projection of the transmission hole 600 on the first transparent electrode layer 200. In some embodiments, the orthographic projection of the light reflective element 800 on the first transparent electrode layer 200 completely overlaps an orthographic projection of the transmission hole 600 on the first transparent electrode layer 200.

Some embodiments of the present invention provide a compensating device for a light emitting diode such as a bottom light emitting diode. The reflective electrode layer in the bottom light emitting diode includes a transmission hole. The bottom light emitting diode may further include a second transparent electrode layer to cover or fill the transmission hole. Light from the pixel region of the bottom light emitting diode can pass through the transmission hole and transmit through the second transparent electrode layer to reach the photosensitive sensor. The photosensitive sensor can sense intensity of the light emitted from each pixel region in real time. After signals based on the changes of the light intensity are collected, intensity of the emitting light of each pixel can be detected or determined. If the light intensity is low or the signals changed, light of the bottom light emitting diode can be compensated based on the detected signals. Accordingly, optical compensation in real time can be realized based on change of signals and/or light intensity. This is a direct way to compensate light of the light emitting diode compared to electronic compensation. The compensating device can realize compensation of change of light intensity due to material ageing of the light emitting layer in real time.

Another example of the present disclosure provides an array substrate. The array substrate includes the light emitting diode of any one of the above embodiments. In some embodiments, the array substrate further includes a TFT to drive the light emitting diode. In some embodiments, as shown in FIGS. 1-3 and 7, the TFT includes a gate electrode 203, a source electrode 201 and a drain electrode 202, a gate insulating layer 204, and an active layer 205. The array substrate may further includes function layers such as a shielding layer 108, a buffer layer 107, an inter-layer dielectric layer 106, a resin layer 104, a passivation layer 105, and a color filter layer 603. The drain electrode 202 is electrically coupled to the first transparent electrode layer 200. In some embodiments, the array substrate may be an OLED array substrate.

In some embodiments, the first transparent electrode layer 200 may be an anode layer, and the reflective electrode layer 300 may be a cathode layer. The anode layer is electrically coupled to the drain electrode 202.

Another example of the present disclosure provides a display panel 20. The display panel 20 includes the light emitting diode according to any one of the above embodiments of the present disclosure. In some embodiments, the display panel 20 includes the array substrate according to one embodiment of the present disclosure.

In some embodiments, the photosensitive sensor 700 is a part of the light emitting diode 10 as shown in FIG. 1 and FIG. 7.

Figure 2:
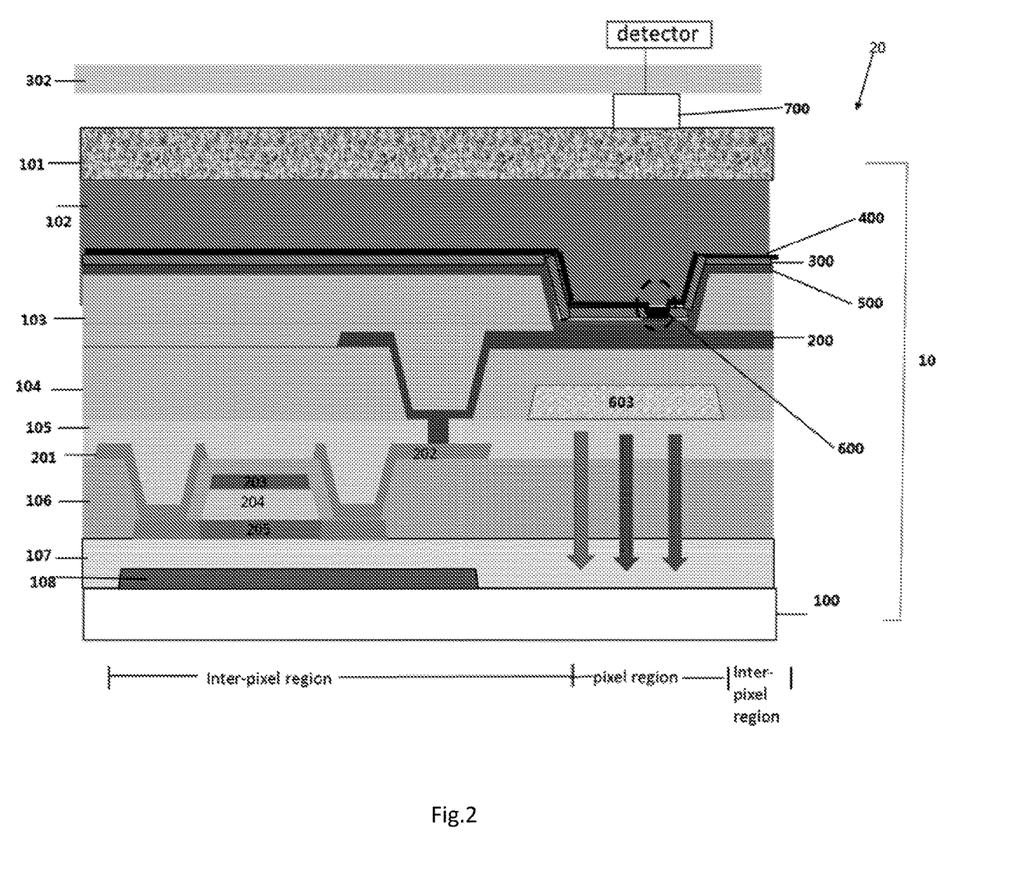
FIG. 2 is a diagram illustrating a structure of a light emitting diode according to some embodiments of the present invention.
Figure 3:
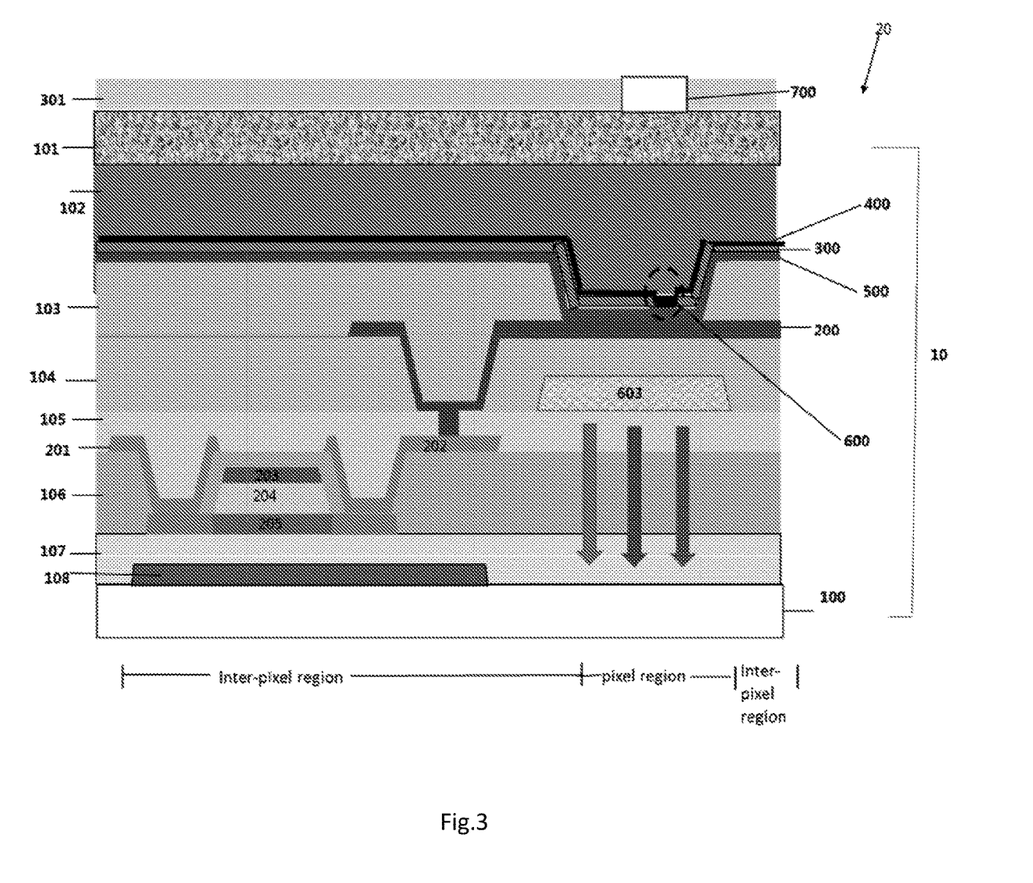
FIG. 3 is a diagram illustrating a structure of a light emitting diode according to some embodiments of the present invention.

In some embodiments, the photosensitive sensor 700 can be located as a part of the display panel 20. In some embodiments, as shown in FIGS. 2 and 3, the display panel 20 includes a first substrate 100, a second substrate 101, and a photosensitive sensor 700. The photosensitive sensor 700 is configured to sense changes of intensity of light transmitted from the transmission hole 600 in the reflective electrode layer 300. The first transparent electrode layer 200, the light emitting layer 500, the reflective electrode layer 300 and the second transparent electrode layer 400 are disposed between the first substrate 100 and the second substrate 101. In some embodiments, as shown in FIG. 2, the photosensitive sensor 700 is on a side of the second substrate 101 opposite from the first substrate 100 and an orthographic projection of the photosensitive sensor 700 on the first transparent electrode layer 200 at least partially overlaps an orthographic projection of the transmission hole 600 on the first transparent electrode layer 200. In some embodiments, as shown in FIG. 2, the display panel further includes a third substrate 302 on a side of the photosensitive sensor 700 opposite from the second substrate 101. The photosensitive sensor 700 is formed between the second substrate 101 and the third substrate 302. In some embodiments, the orthographic projection of the photosensitive sensor 700 on the first transparent electrode layer 200 completely overlaps the orthographic projection of the transmission hole 600 on the first transparent electrode layer 200. In the fabrication process, the photosensitive sensor may be formed on the third substrate 302. The third substrate and the photosensitive sensor are attached to the light emitting diode to form the display panel or apparatus.

In some embodiments, as shown in FIG. 3, the photosensitive sensor 700 is on a side of the second substrate 101 opposite from the first substrate 100 and an orthographic projection of the photosensitive sensor 700 on the first transparent electrode layer 200 at least partially overlaps an orthographic projection of the transmission hole 600 on the first transparent electrode layer 200. In some embodiments, as shown in FIG. 3, the light emitting diode further includes a protection layer 301 on a side of the photosensitive sensor 700 opposite from the second substrate 101 to cover the photosensitive sensor 700. The photosensitive sensor 700 is formed between the second substrate 101 and the protection layer 301. In some embodiments, the orthographic projection of the photosensitive sensor 700 on the first transparent electrode layer 200 completely overlaps the orthographic projection of the transmission hole 600 on the first transparent electrode layer 200. In the fabrication process, the photosensitive sensor may be formed on the light emitting diode, and then the protection layer is formed to cover the photosensitive sensor, thereby forming the display panel or apparatus.

Figure 8:
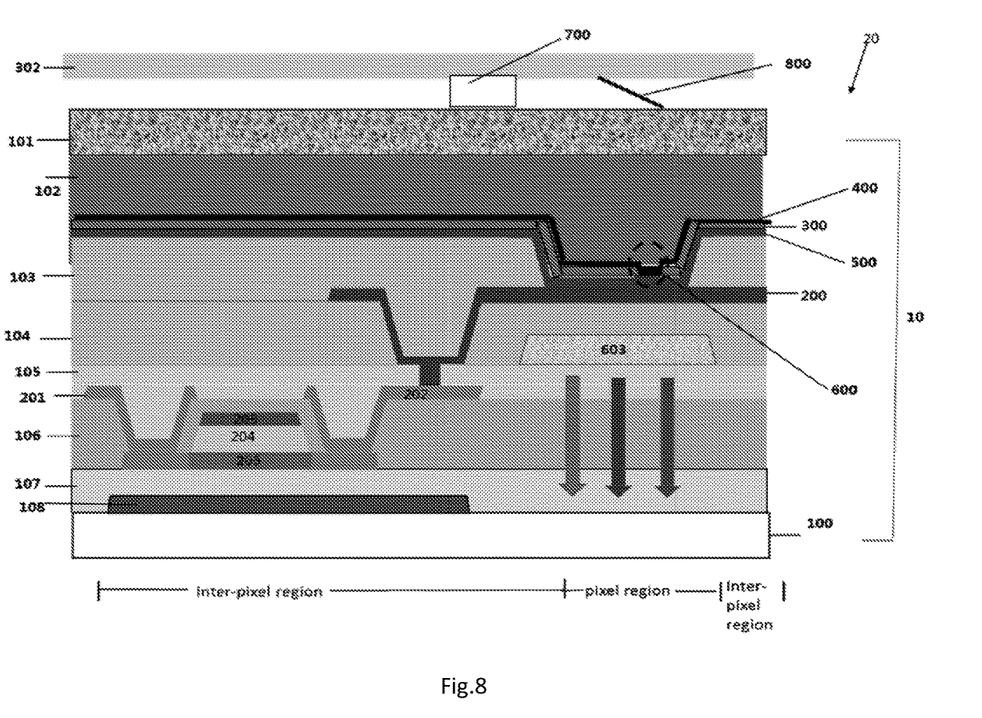
FIG. 8 is a diagram illustrating a structure of a light emitting diode according to some embodiments of the present invention.

The positional relationship between the photosensitive sensor and the transmission hole is not limited as long as the photosensitive sensor can sense changes of intensity of light transmitted from the transmission hole. In some embodiments, the orthographic projection of the photosensitive sensor on the first transparent electrode layer 200 does not overlap the orthographic projection of the transmission hole 600 on the first transparent electrode layer 200. For example, as shown in FIG. 8, the photosensitive sensor can be at any position besides the position directly corresponding to the transmission hole. The light emitting diode may further include a light reflective element 800. The light reflective element 800 may be a layer, a pattern, or particles having a function of reflecting light into the photosensitive sensor. The light reflective element 800 is configured to reflect light into the photosensitive sensor 700. In some embodiments, as shown in FIG. 8, an orthographic projection of the light reflective element 800 on the first transparent electrode layer 200 at least partially overlaps an orthographic projection of the transmission hole 600 on the first transparent electrode layer 200. In some embodiments, the orthographic projection of the light reflective element 800 on the first transparent electrode layer 200 completely overlaps an orthographic projection of the transmission hole 600 on the first transparent electrode layer 200. The photosensitive sensor 700 has a sensing surface facing the light reflective element 800 to receive light.

In some embodiments, as shown in FIG. 2, the display panel includes a detector coupled to the photosensitive sensor 700 to detect signals from the photosensitive sensor 700. The signals are based on changes of intensity of light of the light emitting layer.

In some embodiments, the display panel includes a circuit to compensate the light emitting layer based on the signals detected by the detector.

Another example of the present disclosure provides a display apparatus. The apparatus includes the above light emitting diode according to any one of the above embodiments of the present disclosure. In some embodiments, the display apparatus includes the array substrate according to one embodiment of the present disclosure. In some embodiments, the display apparatus includes the display panel according to one embodiment of the present disclosure. The display apparatus may be any product or component having a display function, such as an electronic paper display, a mobile phone, a tablet computer, a TV set, a display, a notebook computer, a digital photo frame, a navigation device, and so on.

Some embodiments of the invention disclose a compensating device for the display apparatus, the display panel and the array substrate with the light emitting diode, such as a bottom light emitting diode according to one embodiment of the present invention. The reflective electrode layer in the bottom light emitting diode includes a transmission hole. A second transparent electrode layer is formed to cover or fill the transmission hole. Light from the pixel region of the bottom light emitting diode can pass through the transmission hole and transmit through the second transparent electrode layer to reach the photosensitive sensor. The photosensitive sensor can sense intensity of the light emitted from each pixel region in real time. After signals based on the changes of the light intensity are collected, intensity of the light emitted from each pixel can be detected or determined.

If the light intensity is low or the signals changed, light of the bottom light emitting diode can be compensated. Optical compensation in real time can be realized based on change of signals and/or light intensity. This is a direct way to compensate light of the light emitting diode compared to electronic compensation. The compensating device can realize compensation for material ageing of the light emitting layer in real time.

Figure 10:
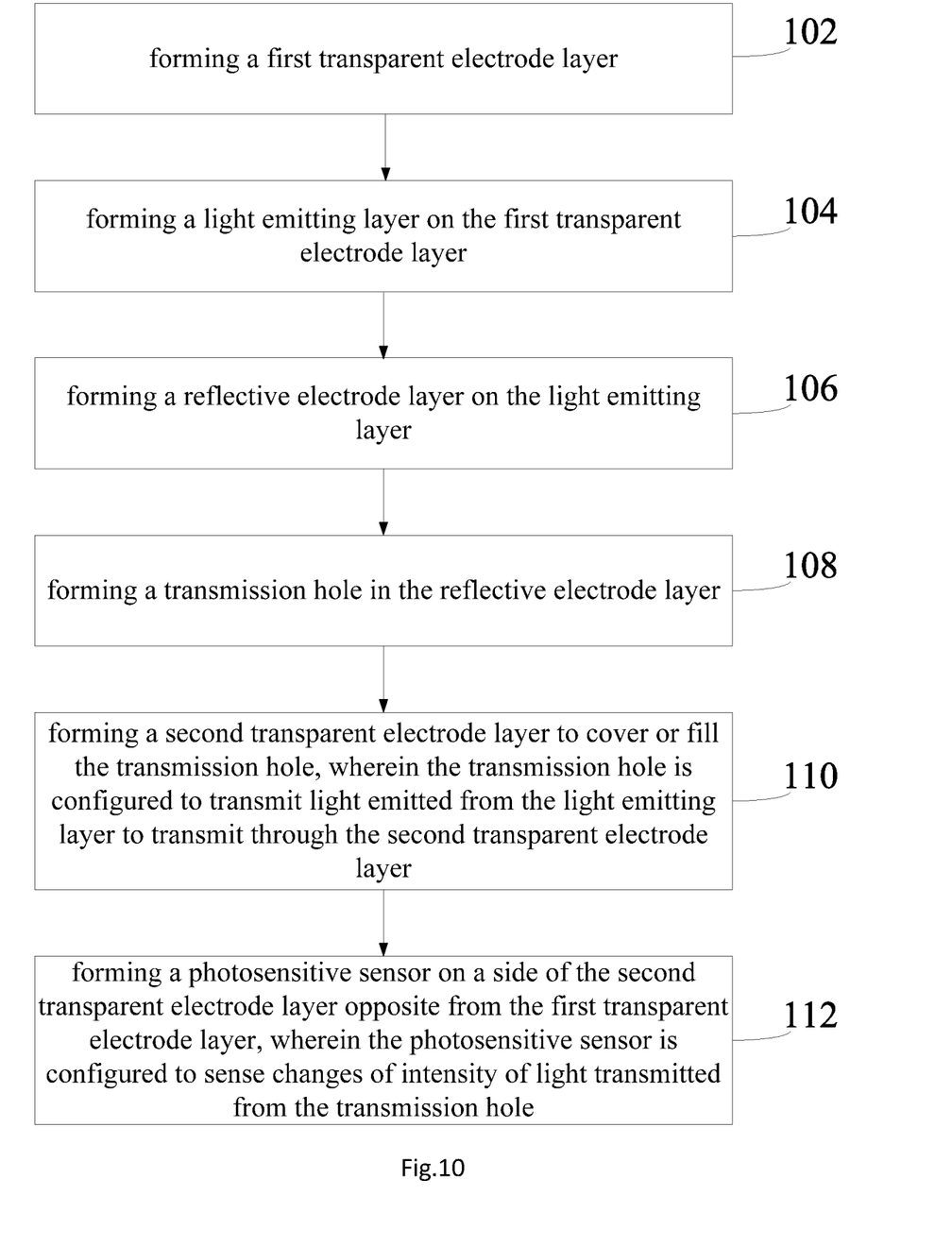
FIG. 10 is a flow chart of a fabrication method of a light emitting diode according to some embodiments of the present invention.

Another example of the present disclosure provides a method for fabricating a light emitting diode. As shown in FIG. 10, the fabrication method includes the following steps 102-110:

Step 102 includes forming a first transparent electrode layer;

Step 104 includes forming a light emitting layer on the first transparent electrode layer;

Step 106 includes forming a reflective electrode layer on the light emitting layer;

Step 108 includes forming a transmission hole in the reflective electrode layer; and Step 110 includes forming a second transparent electrode layer to cover or fill the transmission hole.

The transmission hole is configured to transmit light emitted from the light emitting layer to transmit through the second transparent electrode layer.

In some embodiments, the transmission hole in the reflective electrode layer may be formed by a method including etching a via hole in the reflective electrode layer, such as dry etch in a low temperature. In some embodiments, step 106 and step 108 can be performed in one process, for example, by printing the reflective electrode layer with the transmission hole on the light emitting layer.

In some embodiments, the transmission hole is formed in a cathode layer of a bottom light emitting diode. The cathode layer is made of aluminum (Al) and has a thickness about 150 nm. In some embodiments, step 106 includes forming an Al layer on the light emitting layer and etching the Al layer to form a via hole penetrating the Al layer. In step 110, an ITO layer is formed to cover and/or fill the via hole.

In some embodiments, step 108 includes forming the transmission hole penetrating the reflective electrode layer.

In some embodiments, step 108 includes forming a plurality of sub-holes penetrating the reflective electrode layer to form the transmission hole.

In some embodiments, step 108 includes forming a groove on the reflective electrode layer to form the transmission hole.

In some embodiments, as shown in FIG. 10, the fabrication method of the light emitting diode further includes step 112:

Step 112 includes forming a photosensitive sensor on a side of the second transparent electrode layer opposite from the first transparent electrode layer, wherein the photosensitive sensor is configured to sense change of intensity of light transmitted from the transmission hole.

Another example of the present disclosure provides a method to compensate light of the light emitting diode in the display panel. The compensation method includes steps 200-206:

Step 200 includes sensing light transmitted through the transmission hole and the second transparent electrode layer by a sensor;

Step 202 includes detecting signals from the sensor;

Step 204 includes calculating a compensated value based on the signals of the sensor; and Step 206 includes compensating the light of the light emitting diode based on the compensated value.

In some embodiments, the compensation method may include adjusting the pixel image by CCD (Charge Coupled Device) to make sure that light emitted from all pixels conforms with a gamma curve. In some embodiments, the compensation method may include adjusting the photosensitive sensor to make values of the sensor to correspond to gray values from 0 to 255 and storing the values. Values of the sensor are based on the signals from the sensor. An integrated circuit (IC) can be used to store the values. In some embodiments, the compensation method may be performed during the turning on and/or off of the light emitting diode. For example, during the turning on of the light emitting diode, a few fixed gray values and/or few fixed display brightness values corresponding to the few fixed gray values are randomly selected. The sensor can detect the light and generate values of the sensor, and then compare the generated values of the sensor with the stored values. Data signals inputted into the light emitting diode can be adjusted according to the result of the comparison. The gamma curve will shift due to aging of the OLED. If the result of the comparison reveals the brightness is too strong, the brightness value can be reduced. The sensor then detects the light of the light emitting diode again during displaying image and performs the comparison again, then to compensate again accordingly. The whole compensation process can realize the real-time adjustment to make sure the gamma curve shifting within an allowable range.

Figure 5:
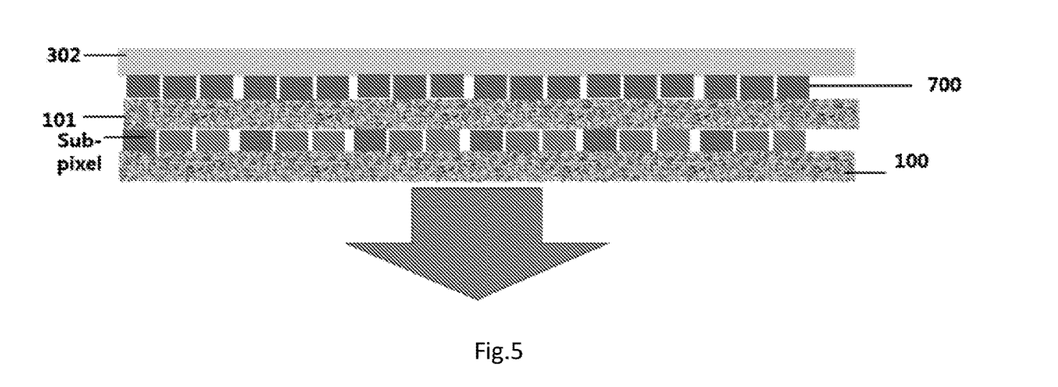
FIG. 5 is a diagram illustrating a structure of a light emitting diode according to some embodiments of the present invention.

As shown in FIG. 5, the light emitting diodes each are a bottom emitting type. The photosensitive sensors 700 are formed on the third substrate 302. The third substrate 302 and the photosensitive sensors 700 are attached to an side of a second substrate opposite from the light emitting layer. Each sub-pixel has a photosensitive sensor to sense the light. In some embodiments, photosensitive sensors may be disposed at a certain interval. In one embodiment every three sub-pixels have a photosensitive sensor. The photosensitive sensor can be disposed above any of the three sub-pixels. The photosensitive sensor can detect light from this sub-pixel and use the detected light as the representative of the pixel including the three sub-pixels.

Figure 9:
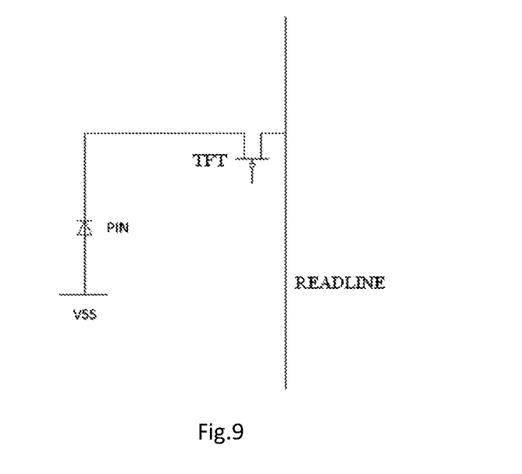
FIG. 9 is a diagram illustrating a structure of a photosensitive sensor according to some embodiments of the present invention.

A structure of the photosensitive sensor is not limited. In some embodiments, as shown in FIG. 9, the photosensitive senor includes a PIN junction and a TFT. The PIN junction has a first end coupled to a power supply terminal VSS and a second end coupled to a first electrode of the TFT. A second electrode of the TFT is coupled to a readline so as to transmit a signal from the PIN junction to the readline for further processing.

The principle and the embodiment of the disclosure are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical embodiment is not limited to the specific combination of the technical features, and also should cover other technical embodiments which are formed by combining the technical features or the equivalent features of the technical features without departing from the inventive concept. For example, technical embodiments may be obtained by replacing the features described above as disclosed in this disclosure (but not limited to) with similar features.

What is claimed is:

1. A light emitting diode, comprising:
a first transparent electrode layer;
a light emitting layer on the first transparent electrode layer;

a reflective electrode layer on a surface of the light emitting layer opposite from the first transparent electrode layer, the reflective electrode layer comprising a transmission hole; and a second transparent electrode layer covering and/or filling the transmission hole;

a photosensitive sensor configured to sense changes of intensity of light transmitted from the transmission hole;

a planarization layer on the second transparent electrode layer;

a light reflective element;

wherein the transmission hole is configured to transmit light emitted from the light emitting layer to transmit through the second transparent electrode layer;

the light reflective element is disposed on the planarization layer;

an orthographic projection of the light reflective element on the first transparent electrode layer at least partially overlaps an orthographic projection of the transmission hole on the first transparent electrode layer;

an orthographic projection of the photosensitive sensor on the first transparent electrode layer does not overlap the orthographic projection of the transmission hole on the first transparent electrode layer.

2. The light emitting diode of claim 1, wherein the transmission hole penetrates through the reflective electrode layer.

3. The light emitting diode of claim 1, wherein the transmission hole comprises a plurality of sub-holes penetrating through the reflective electrode layer, the plurality of sub-holes are disposed inside the transmission hole, and the transmission hole penetrates partially through the reflective electrode layer.

4. The light emitting diode of claim 1, wherein the transmission hole is in a groove in the reflective electrode layer.

5. The light emitting diode of claim 1, wherein the second transparent electrode layer is inside the transmission hole.

6. The light emitting diode of claim 1, further comprising a transparent conductive material inside the transmission hole, wherein the second transparent electrode layer covers the transparent conductive material and the transmission hole.

7. The light emitting diode of claim 1, wherein the second transparent electrode layer covers the transmission hole and further extends to cover at least a portion of the reflective electrode layer.

8. The light emitting diode of claim 1, wherein an area of a cross-section of the transmission hole in a plane parallel to a surface of a pixel region is about 0.5% to about 10% of an area of the pixel region.

9. The light emitting diode of claim 8, wherein a relative position of the transmission hole in each of plurality of pixel regions is substantially the same.

10. The light emitting diode of claim 1, wherein the photosensitive sensor is configured to sense changes of intensity of light transmitted from the transmission hole.

11. An array substrate, comprising the light emitting diode of claim 1 and a thin film transistor to drive the light emitting diode.

12. A display panel, comprising the light emitting diode of claim 1.

13. The display panel of claim 12, further comprising:
a photosensitive sensor configured to sense changes of intensity of light transmitted from the transmission hole.

14. The display panel of claim 13, further comprising:
a first substrate; and a second substrate; wherein:
the first transparent electrode layer, the light emitting layer, the reflective electrode layer and the second transparent electrode layer are between the first substrate and the second substrate;
the photosensitive sensor is on a side of the second substrate facing the first substrate; and
an orthographic projection of the photosensitive sensor on the first transparent electrode layer at least partially overlaps an orthographic projection of the transmission hole on the first transparent electrode layer.

15. The display panel of claim 14, further comprising:
a third substrate or a protection layer on a side of the photosensitive sensor opposite from the second substrate.

16. The display panel of claim 12, further comprising:
a detector coupled to the photosensitive sensor to detect signals from the
photosensitive sensor, the signals being based on changes of intensity of light from the light emitting layer.

17. The display panel of claim 16, further comprising a circuit configured to compensate the light emitting layer based on the signals detected by the detector.

18. A method of fabricating a light emitting diode comprising:
forming a first transparent electrode layer;
forming a light emitting layer on the first transparent electrode layer;
forming a reflective electrode layer on the light emitting layer;
forming a transmission hole in the reflective electrode layer; and
forming a second transparent electrode layer to cover and/or fill the transmission hole;
forming a photosensitive sensor on a side of the second transparent electrode layer opposite from the first transparent electrode layer;
forming a planarization layer on the second transparent electrode layer;
forming a light reflective element on the planarization layer;
wherein the transmission hole is configured to transmit light emitted from the light emitting layer to transmit through the second transparent electrode layer;
the photosensitive sensor is configured to sense changes of intensity of light transmitted from the transmission hole;
an orthographic projection of the light reflective element on the first transparent electrode layer at least partially overlaps an orthographic projection of the transmission hole on the first transparent electrode layer; and
an orthographic projection of the photosensitive sensor on the first transparent electrode layer does not overlap the orthographic projection of the transmission hole on the first transparent electrode layer.

* * * * *